United States Patent
Pyi

(10) Patent No.: US 7,214,584 B2
(45) Date of Patent: May 8, 2007

(54) METHOD FOR FORMING SEMICONDUCTOR DEVICE CAPABLE OF PREVENTING BUNKER DEFECT

(75) Inventor: Seung-Ho Pyi, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 146 days.

(21) Appl. No.: 11/149,297

(22) Filed: Jun. 10, 2005

(65) Prior Publication Data

US 2006/0105538 A1 May 18, 2006

(30) Foreign Application Priority Data

Nov. 18, 2004 (KR) ............. 10-2004-0094592

(51) Int. Cl.
*H01L 21/8242* (2006.01)

(52) U.S. Cl. .............. 438/256; 438/254; 438/397; 438/399; 438/607; 438/675

(58) Field of Classification Search ........ 438/253–254, 438/256, 396–397, 399, 607, 675
See application file for complete search history.

(56) References Cited

U.S. PATENT DOCUMENTS 5,909,059 A * 6/1999 Hada et al. ............... 257/750
6,218,272 B1 * 4/2001 Yeom et al. .............. 438/586
7,052,983 B2 * 5/2006 Park et al. ................ 438/607
2004/0063313 A1 * 4/2004 Shiratake et al. ......... 438/672
2005/0035460 A1 * 2/2005 Tseng ....................... 257/760
2006/0006410 A1 * 1/2006 Lee et al. ................. 257/145

* cited by examiner

*Primary Examiner*—M. Wilczewski
*Assistant Examiner*—Toniae M. Thomas
(74) *Attorney, Agent, or Firm*—Finnegan, Henderson, Farabow, Garrett, & Dunner, L.L.P.

(57) ABSTRACT

Disclosed is a method for preventing a bunker defect generation on a lower portion of a cylinder type metal bottom electrode. The method includes the steps of: forming an etch stop layer on a bottom structure with a conductive region and an insulation region; forming a capacitor insulation layer on the etch stop layer; forming an opening exposing the conductive region by selectively etching the capacitor insulation layer and the etch stop layer; growing a selective epitaxial growth (SEG) layer in the conductive region exposed through the opening; forming a metal layer for a capacitor bottom electrode along a profile provided with the opening; forming an isolated capacitor bottom electrode by removing the metal layer until the capacitor insulation layer is exposed; and removing the capacitor insulation layer, thereby making the capacitor bottom electrode have a cylinder type structure.

19 Claims, 8 Drawing Sheets

METHOD FOR FORMING SEMICONDUCTOR DEVICE CAPABLE OF PREVENTING BUNKER DEFECT

FIELD OF THE INVENTION

The present invention relates to a method for forming a semiconductor device; and more particularly, to a method for forming a semiconductor device capable of preventing a bunker defect caused by a chemical in a cylinder type capacitor due to a structural weakness of a metal bottom electrode.

DESCRIPTION OF RELATED ARTS

As for a semiconductor memory device such as a dynamic random access memory (DRAM) device, there have steadily been efforts to secure a capacitance as much as a decreased pitch in inversely proportionate to a scale of integration. Among those efforts, one of the typical efforts is a structural change of the capacitor due to an increase in a vertical height of the capacitor or a change in the structure of the capacitor into a cylinder or a concave type.

In addition to the structural change of the capacitor, there is another method that uses a dielectric layer having a large dielectric constant and an electrode material for minimizing a depletion of the electrode, i.e., a method that uses a metal material as a bottom electrode rather than polysilicon.

Recently, a method that uses a metal-insulator-metal (MIM) type capacitor employing metals for both top electrode and bottom electrode is considered as a method that aggregates all of the aforementioned methods.

Particularly, at this time, titanium nitride (TiN) is mainly used as an electrode material, and a single structure of aluminum oxide ($Al_2O_3$) or a stack structure of $Al_2O_3$ and hafnium oxide ($HfO_2$) deposited through an atomic layer deposition (ALD) method is used as a dielectric layer for the capacitor.

FIG. 1 is a cross-sectional view briefly illustrating a conventional semiconductor device provided with a capacitor bottom electrode used as a storage node.

Referring to FIG. 1, a first insulation layer 101 is formed on a substrate 100 provided with various elements such as a transistor, a well and a bit line. A cell contact plug 102 electrically connected with a conductive region (not shown) of the substrate 100 is formed by penetrating into the first insulation layer 101.

A second insulation layer 103 is formed on the cell contact plug 102 and then, a conductive layer 104 and a hard mask 105 electrically connected with a portion of the cell contact plug 102 or the substrate 100 are sequentially stacked on the second insulation layer 103. Also, a plurality of bit lines B/L1 and B/L2 including a plurality of spacers on lateral sides of the bit lines B/L1 and B/L2 are formed. A third insulation layer 107 is formed on the bit lines B/L1 and B/L2.

The second insulation layer 103 and the third insulation layer 107 are etched to be aligned with the lateral sides of the bit lines B/L1 and B/L2. Thus, an opening exposing the cell contact plug 102 is formed. Then, a contact plug 108 for a storage node is formed by filling the opening. Herein, the contact plug 108 for the storage node is connected with the cell contact plug 102 and isolated by planarizing an upper portion of the third insulation layer 107.

Herein, both of the cell contact plug 102 and the contact plug 108 for the storage node are made of a conductive silicon layer such as polysilicon.

An etch stop layer 109 made of a nitride based layer is formed on the contact plug 108 for the storage node and the third insulation layer 107. The etch stop layer 109 serves a role in protecting the contact plug 108 for the storage node from being attacked by an etching process performed for forming a storage node of a subsequent capacitor. Then, a capacitor oxide layer 110 is formed on the etch stop layer 109. The capacitor oxide layer 110 and the etch stop layer 109 are etched, thereby forming another opening 111 exposing the contact plug 108 for the storage node. Along a profile provided with the opening 111, a capacitor bottom electrode 112 made of a metal layer such as titanium nitride (TiN) is formed.

Herein, the capacitor oxide layer 110 determines a height of the capacitor, thereby deciding a static electricity capacitance. Accordingly, the capacitor oxide layer 110 is highly deposited in a thickness equal to or more than approximately 20,000 Å.

The capacitor oxide layer 110 mainly uses a structure formed by stacking a phosphosilicateglass (PSG) layer and a tetraethylorthosilicate (TEOS) layer deposited through a plasma enhanced chemical vapor deposition (PECVD) method.

A metal silicide 113 is formed for an ohmic contact that reduces a contact resistance on a portion where the capacitor bottom electrode 112 is contact to the contact plug 108 for the storage node.

The metal silicide 113 is formed by a reaction between a metal of a barrier layer and silicon of the contact plug 108 for the storage node through a thermal process.

Although not shown, the capacitor bottom electrode 112 that is the storage node is isolated and then, the capacitor oxide layer 110 is removed. Thus, the capacitor becomes to have a cylinder type structure. Meanwhile, the cylinder type structure can be formed by performing a full dip-out process during removing the capacitor oxide layer 110 and a concave type structure is formed by performing a partial dip-out process or a dip-out process.

Hereinafter, FIG. 1 exemplifies a case that a titanium (Ti) layer is used as the barrier layer (not shown) and the metal silicide 113 is titanium silicide ($TiSi_2$).

As for a formation of $TiSi_2$, the etch stop layer 109 is excessively etched and afterwards, a Ti layer serving a role of the barrier layer is deposited on the contact plug 108 for the storage node through a chemical vapor deposition (CVD) method using a titanium chlorine ($TiCl_4$) gas as a base gas. Afterwards, a rapid thermal process (RTP) is performed at a temperature of approximately 800° C., thereby forming $TiSi_2$.

In case of using the TiN layer as the bottom electrode 112 in the capacitor with a MIM structure, the TiN layer should be uniformly deposited in a structure with a large ratio of a width of the TiN layer to a height of the TiN layer, i.e., a structure with a large aspect ratio. At this time, the CVD method is mainly used.

If the TiN layer is deposited through the CVD method, the TiN layer typically becomes to have a columnar structure. Accordingly, a bunker defect that the third insulation layer 107 underneath the TiN layer is damaged is induced by an oxide layer etchant used during removing the capacitor oxide layer 110.

FIG. 2 is a cross-sectional photograph illustrating a columnar structure of a TiN bottom electrode thin layer deposited through a CVD method.

Referring to FIG. 2, the contact plug 108 for the storage node, the metal silicide 113 and the etch stop layer 109 are illustrated and the cylinder type TiN bottom electrode 112 is deposited through the CVD method.

FIG. 3 is a photograph illustrating a cross-sectional view that the third insulation layer is damaged during a dip-out process performed for forming the cylinder type.

Referring to FIG. 3, as the capacitor oxide layer 110 is removed due to a wet dip-out process, it should be noted that the TiN bottom electrode 112 becomes to have a cylinder type structure. Also, the third insulation layer underneath the TiN bottom electrode 112 is damaged by a chemical attack, thereby generating a bunker defect X.

SUMMARY OF THE INVENTION

It is, therefore, an object of the present invention to provide a method for preventing a bunker defect generation on a lower portion of a cylinder type metal bottom electrode.

In accordance with one aspect of the present invention, there is provided a method for fabricating a semiconductor device, including the steps of: forming an etch stop layer on a bottom structure with a conductive region and an insulation region; forming a capacitor insulation layer on the etch stop layer; forming an opening exposing the conductive region by selectively etching the capacitor insulation layer and the etch stop layer; growing a selective epitaxial growth (SEG) layer in the conductive region exposed through the opening; forming a metal layer for a capacitor bottom electrode along a profile provided with the opening; forming an isolated capacitor bottom electrode by removing the metal layer until the capacitor insulation layer is exposed; and removing the capacitor insulation layer, thereby making the capacitor bottom electrode have a cylinder type structure.

In accordance with another aspect of the present invention, there is provided a method for fabricating a semiconductor device, including the steps of: forming a first insulation layer on a substrate; forming a cell contact plug contacted to the substrate by penetrating into the first insulation layer; forming a second insulation layer on the cell contact plug and the first insulation layer; forming a bit line on the second insulation layer; forming a third insulation layer on the bit line; forming a first opening aligned with lateral sides of the bit line and exposing the cell contact plug by selectively etching the third insulation layer and the second insulation layer; forming a plug made of polysilicon for a storage node to fill the first opening, thereby being planarized with the third insulation layer; forming an etch stop layer on the plug for the storage node and the third insulation layer; forming a capacitor insulation layer on the etch stop layer; forming a second opening that exposes the plug for the storage node by selectively etching the capacitor insulation layer and the etch stop layer; growing a SEG layer from the plug for the storage node exposed through the second opening; forming a metal layer for a capacitor bottom electrode along a profile provided with the second opening; forming an isolated capacitor bottom electrode by removing the metal layer until the capacitor insulation layer is exposed; and removing the capacitor insulation layer, thereby making the capacitor bottom electrode have a cylinder type structure.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

FIGS. 4A to 4E are cross-sectional views illustrating a method for fabricating a semiconductor device in accordance with the present invention.

Figure 1:
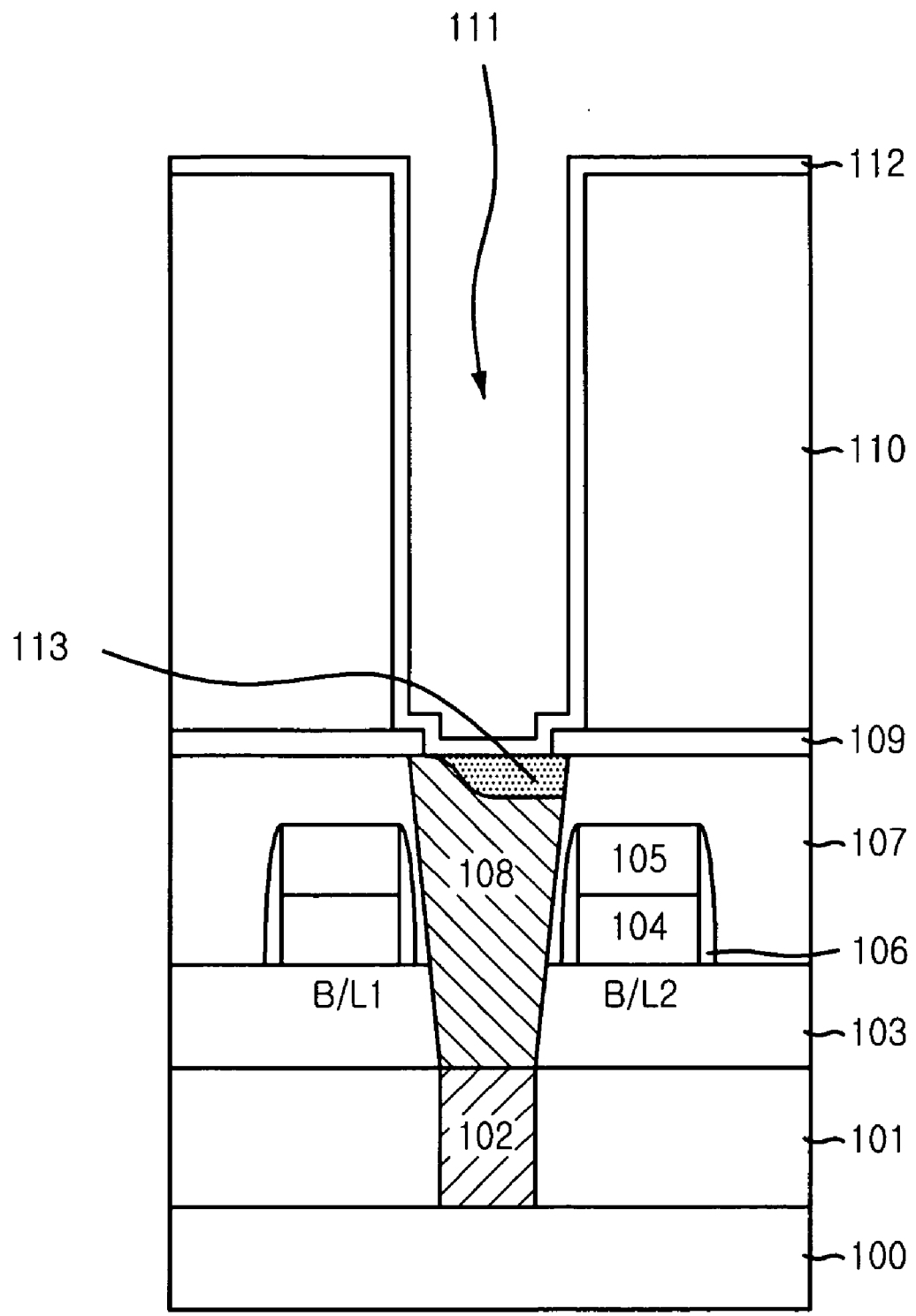
FIG. 1 is a cross-sectional view briefly illustrating a semiconductor device provided with a conventional capacitor bottom electrode used as a storage node.
Figure 2:
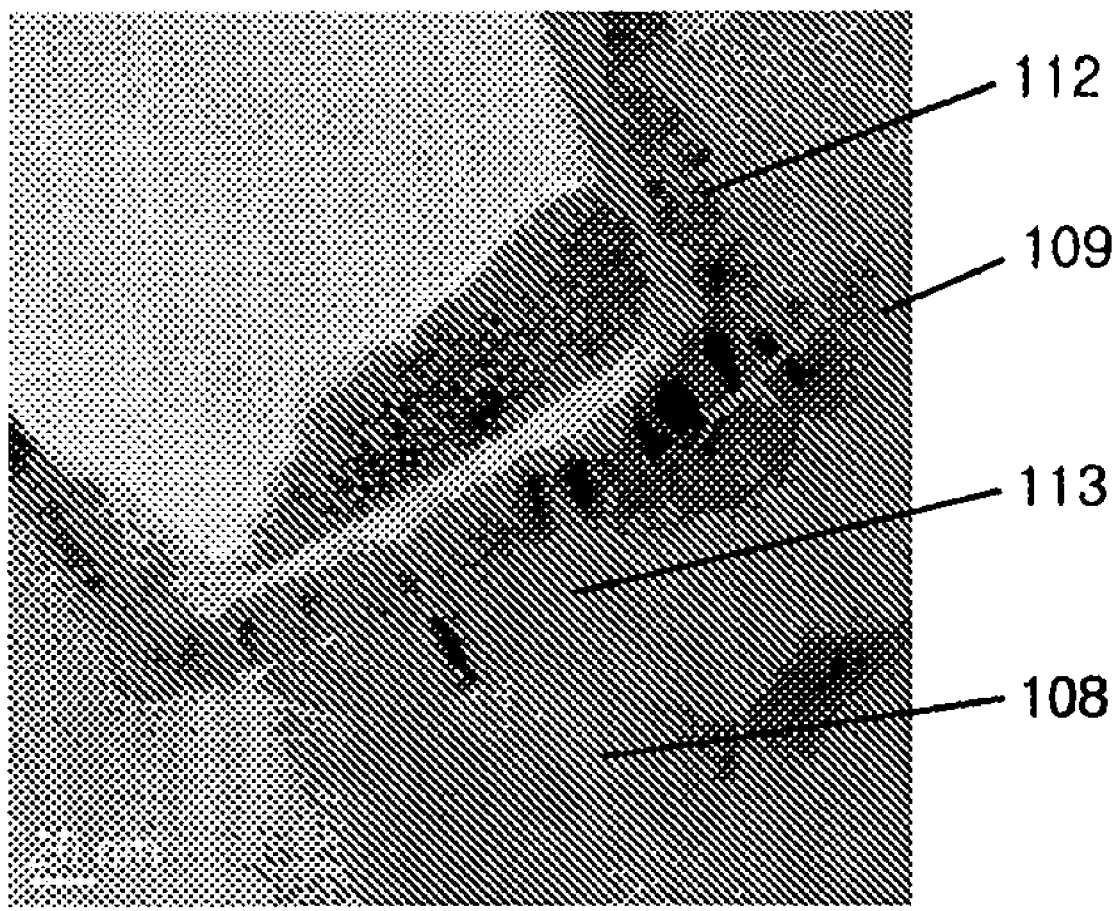
FIG. 2 is a cross-sectional photograph illustrating a columnar structure of a conventional titanium nitride (TiN) bottom electrode thin layer deposited through a chemical vapor deposition (CVD) method.
Figure 3:
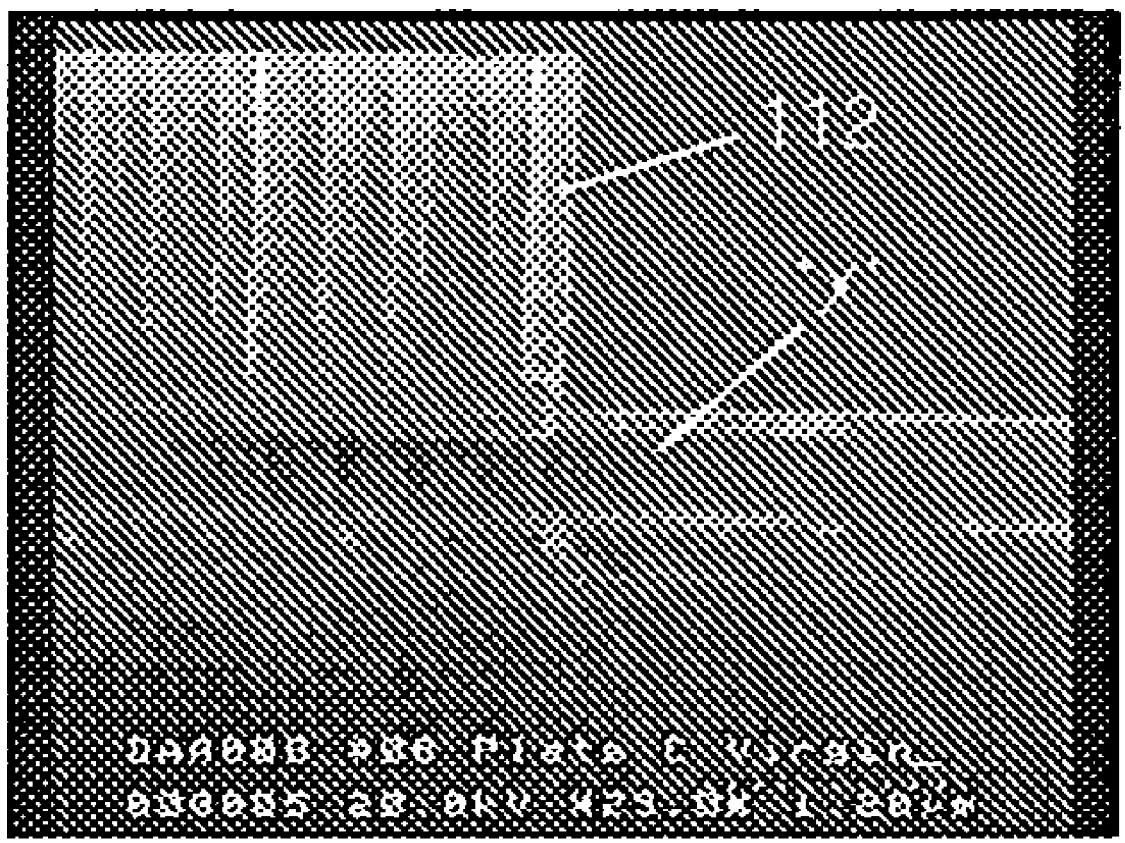
FIG. 3 is a photograph illustrating a cross-sectional view that a conventional insulation layer is damaged during a dip-out process performed for forming a cylinder type.
Figure 4A:
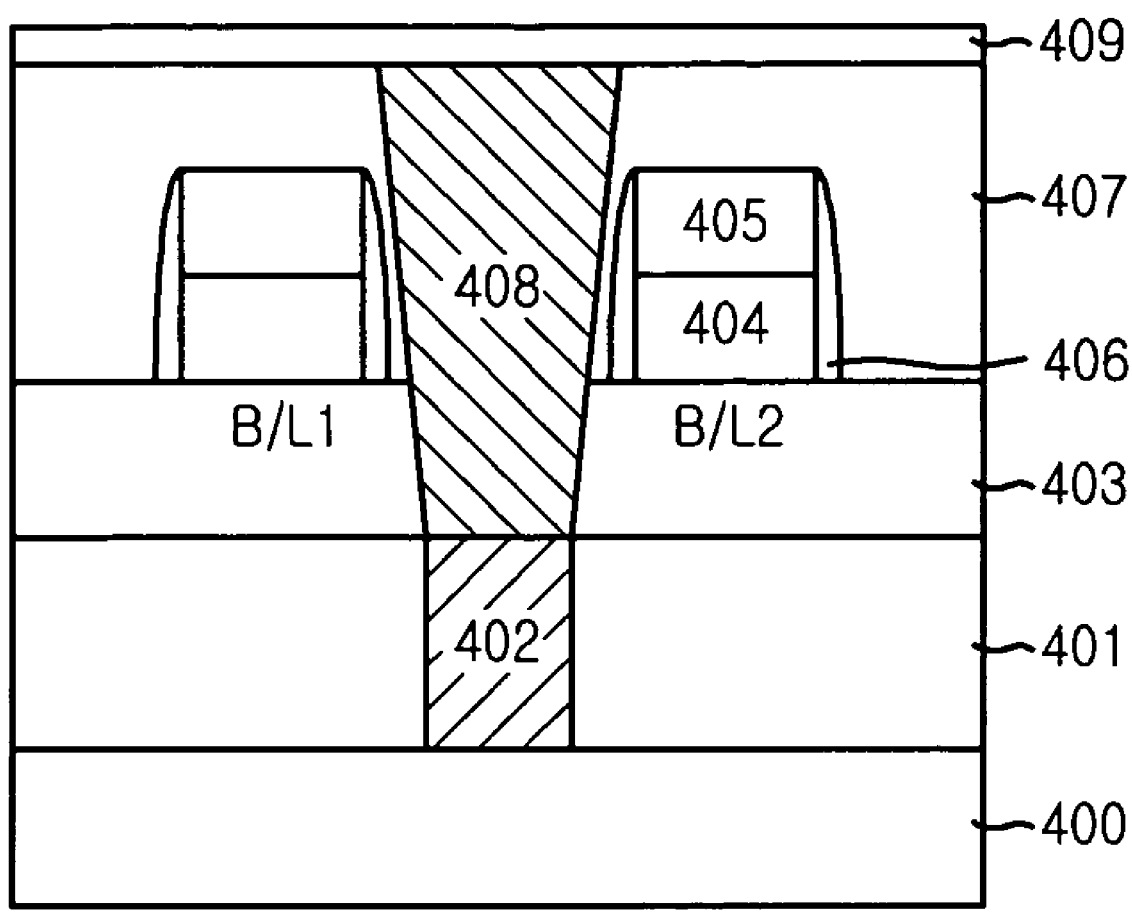
FIGS. 4A to 4E are cross-sectional views illustrating a process for forming a semiconductor device in accordance with the present invention.

As shown in FIG. 4A, a first insulation layer 401 is formed on a substrate 400 provided with various elements such as a well and a transistor.

The first insulation layer 401 is made of an oxide based layer selected from a group consisting of a borosilicateglass (BSG) layer, a borophosphosilicateglass (BPSG) layer, a phosphosilicateglass (PSG) layer, a silicon oxide layer using a source of tetraethylorthosilicate (TEOS), a high density plasma (HDP) oxide layer, a spin-on-glass (SOG) layer and an advanced planarization layer (APL). Also, the first insulation layer 401 can be made of an inorganic or organic based low dielectric layer in addition to the oxide based layer.

Herein, a gate electrode pattern is not illustrated in this cross-sectional view.

Subsequently, the first insulation layer 401 is selectively etched, thereby exposing an impurity diffusion region (not shown) of the substrate 400. Afterwards, a conductive silicon layer is deposited to sufficiently fill the exposed impurity diffusion region. Then, a chemical mechanical polishing (CMP) process is performed until the first insulation layer 401 is exposed, or an etch back process is employed. Thus, a cell contact plug 402 contacted to the impurity diffusion region of the substrate 400 and practically planarized with the first insulation layer 401 is formed.

The conductive silicon layer for forming the cell contact plug 402 includes a doped polysilicon layer or an amorphous silicon layer.

Next, a second insulation layer 403 is formed on an entire surface provided with the cell contact plug 402. Afterwards, a plurality of bit lines B/L1 and B/L2 are formed on the second insulation layer 403. The individual bit line is formed with a hard mask 405, a conductive layer 404 and spacers 406 on each lateral side of the hard mask 405 and the conductive layer 404.

Next, a third insulation layer 407 is formed on the bit lines B/L1 and B/L2.

The second insulation layer 403 and the third insulation layer 407 are made of the same material.

Subsequently, the third insulation layer 407 and the second insulation layer 403 are selectively etched, thereby forming a first opening exposing the cell contact plug 402. Then, a conductive silicon layer is deposited to sufficiently fill the first opening and afterwards, the CMP process or the etch back process is employed until the third insulation layer 407 is exposed. Thus, the first opening is filed and a plug 408 for a storage node practically planarized with the third insulation layer 407 is formed.

Herein, the conductive silicon layer for forming the plug 408 for the storage node includes a doped polysilicon layer or an amorphous silicon layer.

An etch stop layer 409 is formed on the plug 408 for the storage node and the third insulation layer 407. The etch stop layer 409 serves a role in protecting a bottom structure such as the plug 408 for the storage node from an attack during a subsequent etching process performed for forming a bottom electrode that is a storage node of the capacitor. Thus, the etch stop layer 409 is made of a nitride based layer having an etch selectivity with respect to the oxide based layer.

Figure 4B:
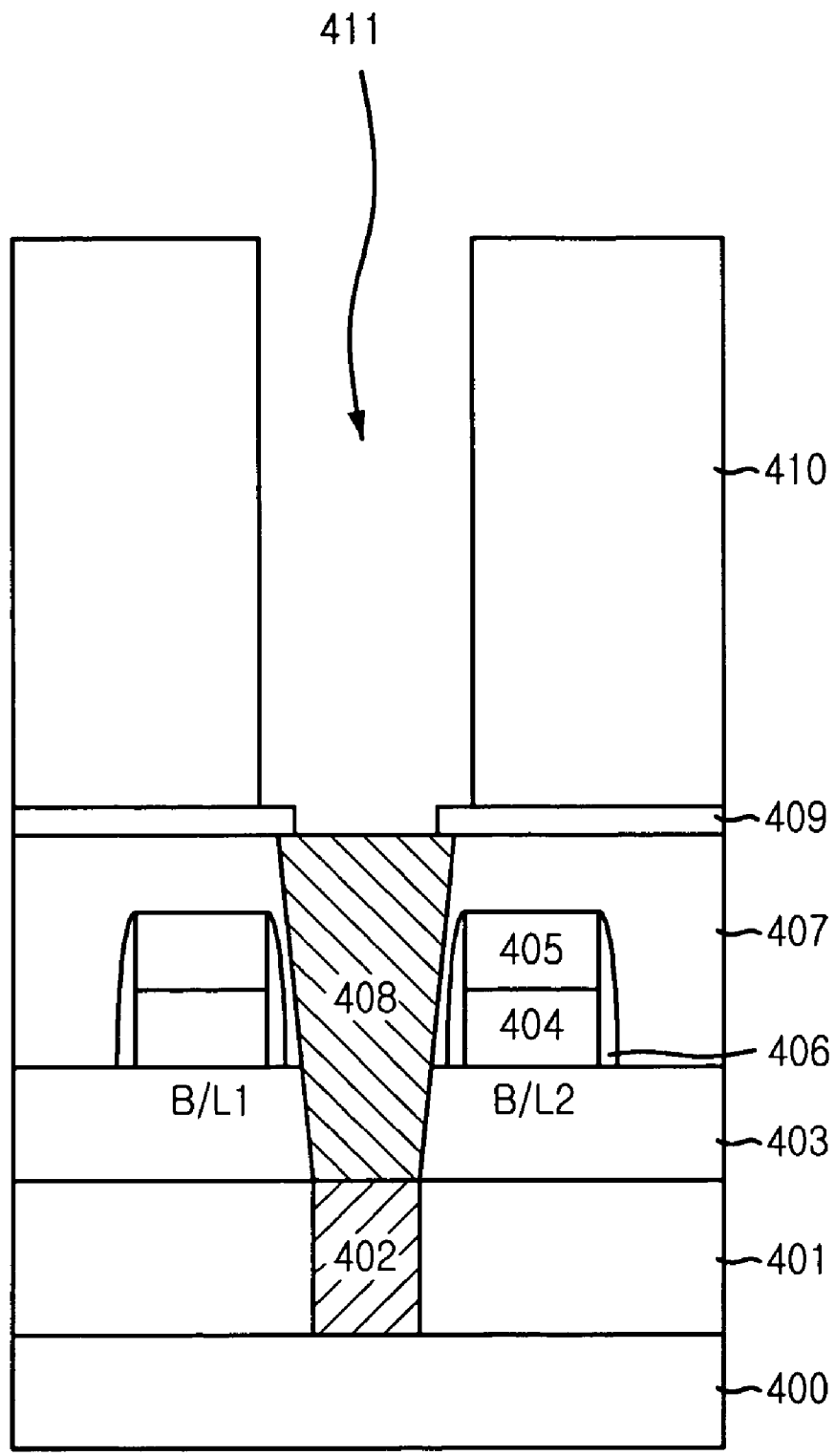

As shown in FIG. 4B, a capacitor insulation layer 410 is formed on the etch stop layer 409.

The capacitor insulation layer 410 can be made by using the same material used for forming the first, the second and the third insulation layers 401, 403 and 407. Mainly, the etch stop layer 409 is formed as a stack structure of a plasma enhanced (PE)-TEOS layer and a PSG layer.

Next, the capacitor insulation layer 410 and the etch stop layer 409 are selectively etched, thereby forming another opening 411 exposing the plug 408 for the storage node.

Figure 4C:
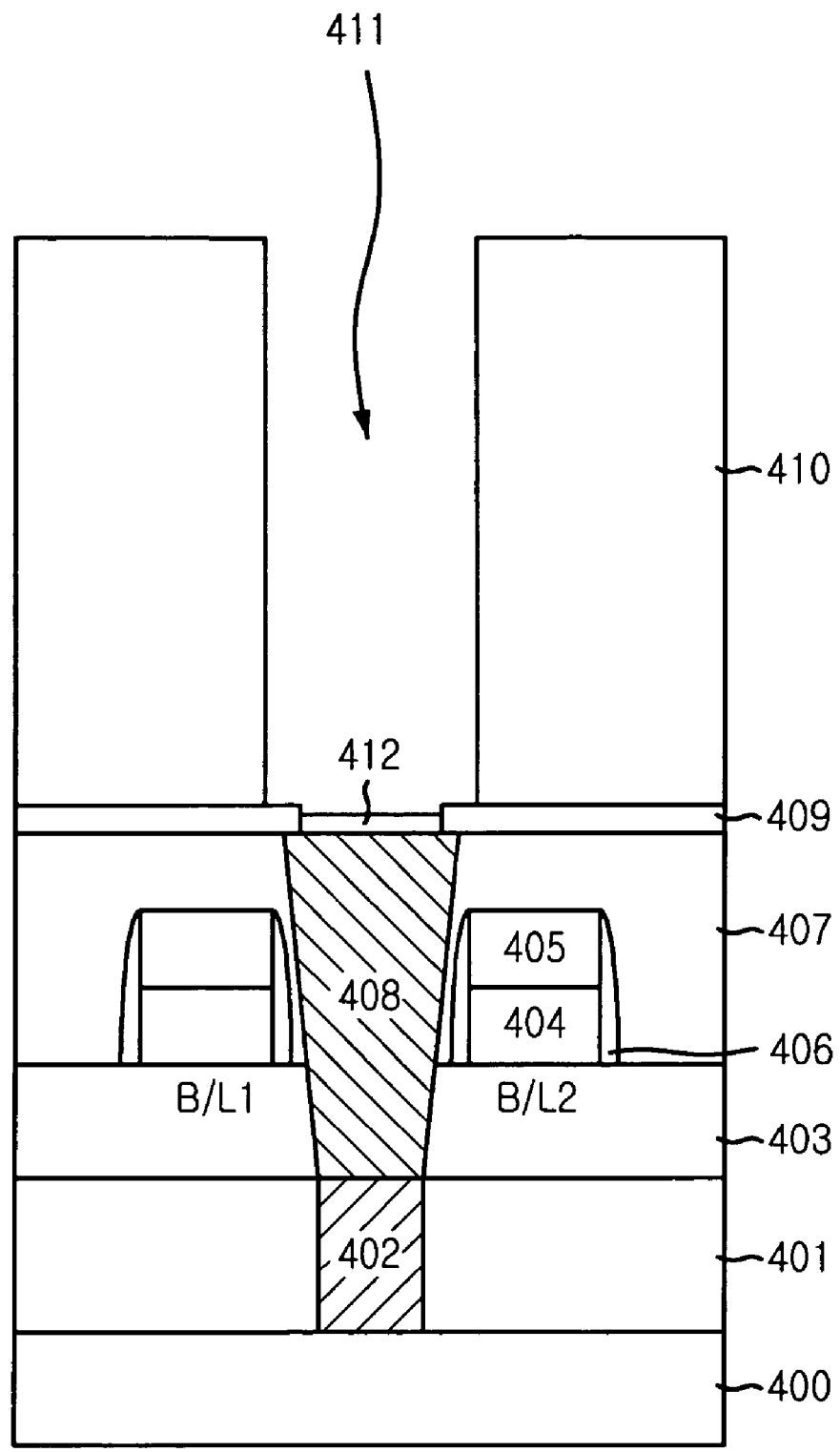

As shown in FIG. 4C, a silicon layer grown from the plug 408 for the storage node exposed from the opening 411, i.e., a SEG layer, is formed through a selective epitaxial growth (SEG) process.

The SEG layer 412 serves a role in spacing out between the bottom electrode and the third insulation layer 407 in a predetermined portion. The SEG layer can be formed in a height equal to, higher or lower than the etch stop layer 409. However, it is preferable to form the etch stop layer lower than the etch stop layer 409.

The SEG layer is a silicon layer grown in a single crystal form from the polysilicon layer used as the plug 408 used as the storage node. If there is a foreign body on a surface of the exposed plug 408 for the storage node, it is hard to grow the silicon layer completely. Accordingly, it is preferable to remove the foreign body by performing a cleaning process before the SEG process is employed. During performing the cleaning process, a dry cleaning process is employed.

The SEG process is carried out at a temperature ranging from approximately 700° C. to approximately 900° C. and dichlorosilane (DCS), hydrogen chloride (HCl) and phosphine ($PH_3$) are used as a source.

Figure 4D:
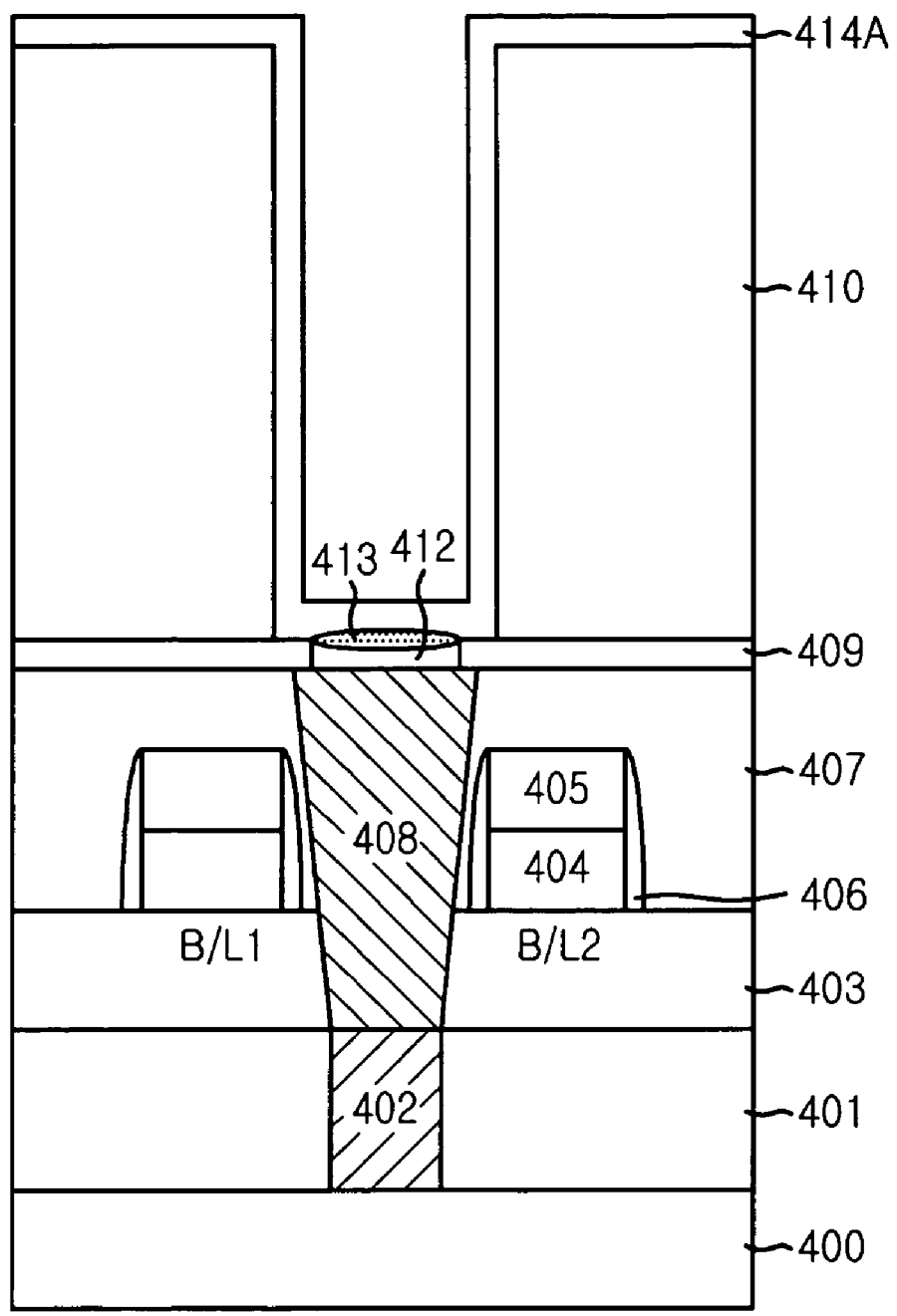

As shown in FIG. 4D, a metal silicide 413 is formed on a surface on the SEG layer 412 exposed through the opening 411.

Hereinafter, a process for forming the metal silicide 413 is explained.

First, a metal layer is deposited along an etched profile provided with the opening 411. At this time, a Ti layer is mainly used as the metal layer and a chemical vapor deposition (CVD) method employing a titanium tetrachloride ($TiCl_4$) is used.

Subsequently, the metal silicide 413 is formed due to a reaction between the metal layer and the SEG layer 412 on a lower portion of the opening 411 by performing a thermal process using a rapid thermal process (RTP) at a temperature of approximately 800° C. In case of that the metal layer is the Ti layer, the metal silicide 413 is formed by reacting Ti of the metal layer with silicon of the SEG layer 412.

At this time, the metal layer that has not yet reacted can be removed or not. If the metal layer that has not yet reacted is not removed, the metal layer can be used as a barrier layer. Also, the metal layer that has not yet reacted can be used as the barrier layer by additionally depositing a plurality of metal layers.

Along the entire profile, a metal layer 414A for a bottom electrode is formed. The metal layer 414A for the bottom electrode can be formed by using a TiN layer.

Figure 4E:
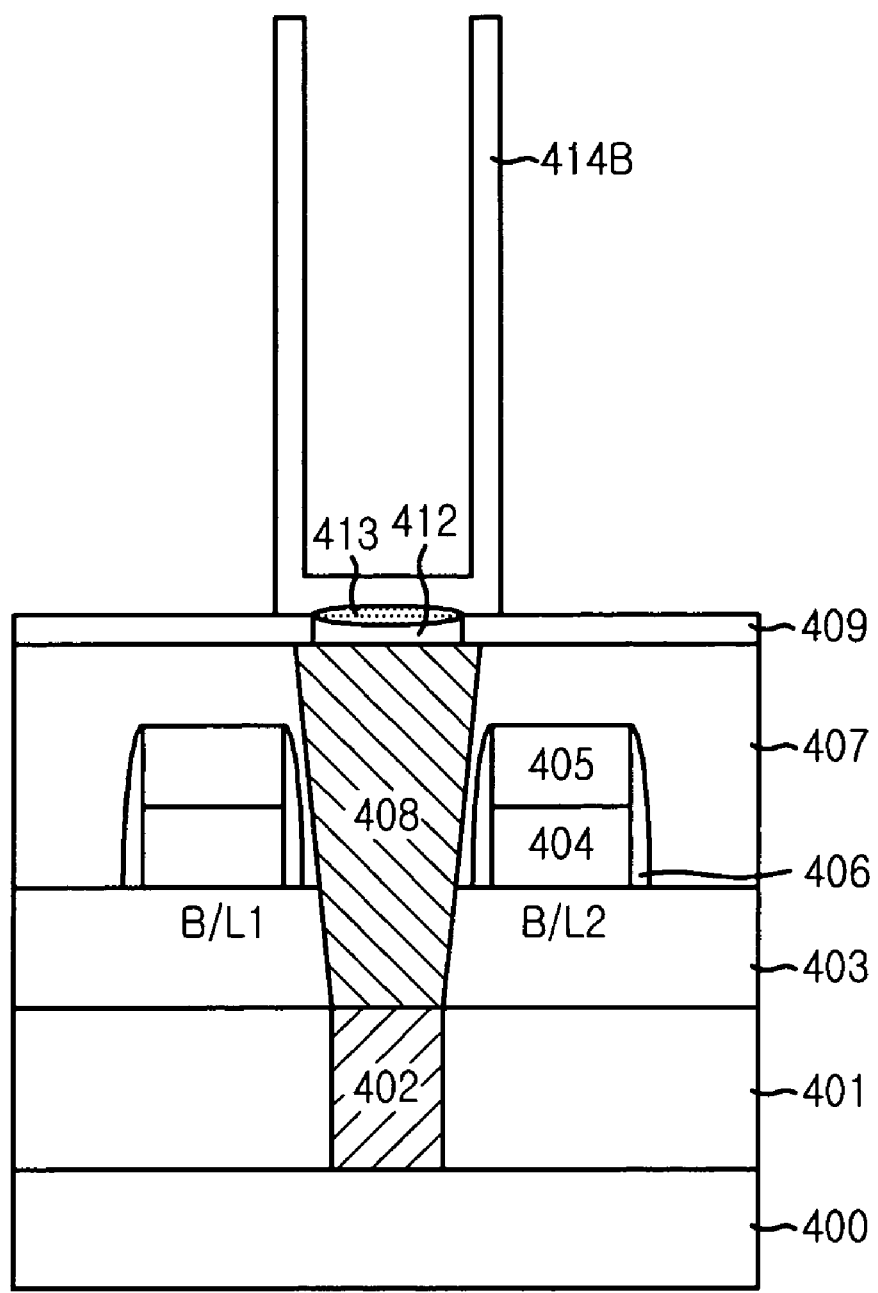

As shown in FIG. 4E, a passivation layer such as a photoresist layer or an organic low dielectric layer is deposited on an entire surface provided with the metal layer 414A for the bottom electrode. Afterwards, a planarizing process for an isolation is performed, thereby removing the metal layer 414A on the insulation layer 410. Afterwards, the capacitor insulation layer 410 is removed through a dip-out process.

During performing the dip-out process, a chemical mixed with ammonium fluoride ($NH_4F$) and hydrogen fluoride (HF) is used. Although the chemical penetrates into a bottom structure through the TiN layer that is the columnar structure during the dip-out process, it is possible to prevent an attack with respect to the third insulation layer 407 sine the SEG layer 412 rather than the oxide based third insulation layer 407 exists underneath the TiN layer.

As described above, the SEG layer is formed between the bottom electrode and the oxide based insulation layer by growing the SEG layer from the plug for the storage node of the opening after the opening for forming the capacitor is formed. Thus, it is possible to prevent an attack caused by the chemical penetrated into the bottom electrode during the dip-out process performed for forming the cylinder type bottom electrode.

The present invention prevents a bunker defect by preventing the attack caused by the chemical, thereby improving yields of the semiconductor device.

The present application contains subject matter related to the Korean patent application No. KR 2004-0094592, filed in the Korean Patent Office on Nov. 18, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
   forming an etch stop layer on a bottom structure with a conductive region and an insulation region;
   forming a capacitor insulation layer on the etch stop layer;
   forming an opening exposing the conductive region by selectively etching the capacitor insulation layer and the etch stop layer;
   growing a selective epitaxial growth (SEG) layer in the conductive region exposed through the opening;
   forming a metal layer for a capacitor bottom electrode along a profile provided with the opening;
   forming an isolated capacitor bottom electrode by removing the metal layer until the capacitor insulation layer is exposed; and
   removing the capacitor insulation layer, thereby making the capacitor bottom electrode have a cylinder type structure.

2. The method of claim 1, wherein the conductive region and the SEG layer include a silicon layer.

3. The method of claim 1, wherein the metal layer for the capacitor bottom electrode is a columnar structure.

4. The method of claim 2, wherein the metal layer for the capacitor bottom electrode is a columnar structure.

5. The method of claim 3, wherein the metal layer for the capacitor bottom electrode includes a titanium nitride (TiN) layer.

6. The method of claim 4, wherein the metal layer for the capacitor bottom electrode includes a TiN layer.

7. The method of claim 1, wherein at the step of forming the SEG layer, the SEG layer is formed lower than the etch stop layer.

8. The method of claim 2, wherein at the step of forming the SEG layer, the SEG layer is formed lower than the etch stop layer.

9. The method of claim 2, wherein the step of forming the SEG layer is performed by using dichlorosilane (DCS), hydrogen chloride (HCl) and phosphine ($PH_3$) as a source at a temperature ranging from approximately 700° C. to approximately 900° C.

10. The method of claim 1, further including the step of performing a cleaning process for removing a foreign body in the conductive region exposed through the opening before the step of performing the SEG layer is carried out.

11. The method of claim 2, further including the step of performing a cleaning process for removing a foreign body in the conductive region exposed through the opening before the step of performing the SEG layer is carried out.

12. The method of claim 1, wherein the capacitor insulation layer is oxide based; the etch stop layer is nitride based; and the step of removing the capacitor insulation layer is carried out through a dip-out process employing a chemical mixed with ammonium fluoride ($NH_4F$) and hydrogen fluoride (HF).

13. A method for fabricating a semiconductor device, comprising the steps of:
    forming a first insulation layer on a substrate;
    forming a cell contact plug contacted to the substrate by penetrating into the first insulation layer;
    forming a second insulation layer on the cell contact plug and the first insulation layer;
    forming a bit line on the second insulation layer;
    forming a third insulation layer on the bit line;
    forming a first opening aligned with lateral sides of the bit line and exposing the cell contact plug by selectively etching the third insulation layer and the second insulation layer;
    forming a plug made of polysilicon for a storage node to fill the first opening, thereby being planarized with the third insulation layer;
    forming an etch stop layer on the plug for the storage node and the third insulation layer;
    forming a capacitor insulation layer on the etch stop layer;
    forming a second opening that exposes the plug for the storage node by selectively etching the capacitor insulation layer and the etch stop layer;
    growing a SEG layer from the plug for the storage node exposed through the second opening;
    forming a metal layer for a capacitor bottom electrode along a profile provided with the second opening;
    forming an isolated capacitor bottom electrode by removing the metal layer until the capacitor insulation layer is exposed; and
    removing the capacitor insulation layer, thereby making the capacitor bottom electrode have a cylinder type structure.

14. The method of claim 13, wherein the metal layer for the capacitor bottom electrode is a columnar structure.

15. The method of claim 14, wherein the metal layer for the capacitor bottom electrode includes a TiN layer.

16. The method of claim 13, wherein at the stop of forming the SEG layer, the SEG layer is formed lower than the etch stop layer.

17. The method of claim 13, wherein the step of forming the SEG layer is performed at a temperature ranging from approximately 700° C. to approximately 900° C. by using DCS, HCl and $PH_3$ as a source.

18. The method of claim 13, further including a cleaning process for removing a foreign body of the plug for the storage node exposed through the second opening before the step of forming the SEG layer is carried out.

19. The method of claim 13, wherein the first, the second and the third insulation layers and the capacitor insulation layer are oxide based; the etch stop layer is nitride based; and the step of forming the capacitor insulation layer is carried out through a dip-out process by using a chemical mixed with $NH_4F$ and HF.

* * * * *